United States Patent
Mei et al.

(10) Patent No.: US 7,352,229 B1
(45) Date of Patent: Apr. 1, 2008

(54) REFERENCE CLOCK RECEIVER COMPLIANT WITH LVPECL, LVDS AND PCI-EXPRESS SUPPORTING BOTH AC COUPLING AND DC COUPLING

(75) Inventors: Haitao Mei, Kanata (CA); Shoujun Wang, Kanata (CA); William Bereza, Nepean (CA); Mirza Baig, Nepean (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/484,366

(22) Filed: Jul. 10, 2006

(51) Int. Cl.
    *H03L 5/00* (2006.01)
(52) U.S. Cl. ...................... 327/333; 327/306
(58) Field of Classification Search .............. 327/306, 327/333; 326/80–81
    See application file for complete search history.

(56) References Cited

U.S. PATENT DOCUMENTS

| | | | |
|---|---|---|---|
| 4,797,583 A * | 1/1989 | Ueno et al. | 326/66 |
| 5,606,268 A * | 2/1997 | Van Brunt | 326/68 |
| 5,736,871 A | 4/1998 | Goto | |
| 5,818,278 A * | 10/1998 | Yamamoto et al. | 327/333 |
| 5,999,020 A | 12/1999 | Volk et al. | |
| 6,026,051 A | 2/2000 | Keeth et al. | |
| 6,462,890 B2 * | 10/2002 | Hsu | 359/738 |
| 6,501,306 B1 * | 12/2002 | Kim et al. | 327/112 |
| 6,774,695 B2 * | 8/2004 | Hayashi et al. | 327/333 |
| 6,800,554 B2 * | 10/2004 | Marieb et al. | 438/687 |
| 6,946,893 B2 * | 9/2005 | Hayashi et al. | 327/333 |
| 7,112,996 B2 * | 9/2006 | Lee | 326/68 |

* cited by examiner

*Primary Examiner*—Dinh T. Le
(74) *Attorney, Agent, or Firm*—Ropes & Gray LLP; Brian E. Mack

(57) ABSTRACT

A reference clock receiver structure according to the invention is provided. The structure preferably includes an input buffer that is formed from a PMOS differentiated pair of transistors and a first supply voltage. The PMOS differential pair receives a pair of differential inputs, and produces a pair of differential outputs. The structure also includes a level shifter that is coupled to receive the pair of differential outputs from the input buffer to provide gain to the pair of differential outputs to form a gained pair of differential outputs. The level shifter that includes a second supply voltage. The second supply voltage may have a smaller magnitude than the first supply voltage. Finally, the structure includes a CMOS buffer that is coupled to receive the gained pair of differential outputs. The CMOS buffer boosts the gained pair of differential outputs and converts the gained differential pair outputs into a single signal.

21 Claims, 5 Drawing Sheets

US 7,352,229 B1

REFERENCE CLOCK RECEIVER COMPLIANT WITH LVPECL, LVDS AND PCI-EXPRESS SUPPORTING BOTH AC COUPLING AND DC COUPLING

BACKGROUND OF THE INVENTION

This invention relates to reference clock receivers for use with Programmable Logic Devices (PCDs) or any other suitable electronic device.

Clock multiplier phase-lock loops (PLL) in transceivers usually require a "clean" reference clock that is generated from an external crystal clock source. The output voltages of the crystal are typically differential voltages. These voltages may be compliant with different standards such as LVPECL (Vcm=1.8825 volts~2.05 volts), LVDS (Vcm=~1.25 v volts), and PCI-Express (Vcm=0.25 volts~0.55 volts). Then a reference clock receiver is needed to take the differential signals with differential voltage levels and convert them to a signal level that is compatible with the core supply voltage in the high-speed serial interface portion of the PLD.

FIG. 1 shows a circuit that shows a conventional reference clock receiver structure 100. Reference clock receiver structure 100 includes input buffer 102, level shift 104, and CMOS buffer 106. The first stage input buffer 102, is a differential pair of transistors to receive differential inputs (IP and IN). The differential pair consists of thick oxide 3.3 volts devices to withstand higher voltage levels seen at the input of the structure.

The second stage is basically a level shift stage 104 and provides sufficient gain to increase signal swing.

The third stage 106 further boosts the input signal to provide CMOS level outputs. Duty-cycle connection of the signal is performed in this stage to reduce jitters.

For an input buffer with NMOS differential pair of transistors 202 and 204, as shown in FIG. 2, the lower end of input common mode range is limited to $Vgs_{transistor\ 202/transistor\ 204} + VdSAT_{transistor\ 212}$. Resistors 206 and 208 also are used with the differential pair and transistor 210 forms a current mirror together with transistor 212.

As stated above, in order to be tolerant of high voltage input signals, NMOS differential pair 202 and 204 should be formed from thick oxide. As such, this NMOS-based differential pair's lowest common-mode voltage is sub-optimal because thick oxide devices have larger threshold voltages. In such circumstances, input common-mode voltage could be relatively very high (e.g., above 1 volt). This conventional structure may not be able to meet specifications of certain new industry standards such as PCI-Express, whose reference clocks have a common-mode range from 0.25 volts to 0.55 volts.

It would be desirable to provide a receiver clock structure that is able to accommodate a relatively wide input common-mode range.

It would also be desirable to provide a receiver clock structure that includes a differential pair formed from relatively thick oxide structures while still being able to accommodate a relatively wide input common-mode range.

SUMMARY OF THE INVENTION

It is an object of the invention to provide a receiver clock structure that is able to accommodate a relatively wide input common-mode range.

It is another object of the invention to provide a clock structure that includes a differential pair formed from relatively thick oxide structures while still being able to accommodate a relatively wide input common-mode range.

A method of converting an external clock signal source in the form of a differential pair into a reference clock signal is provided. The method includes receiving the pair of differential inputs and buffering the pair of differential outputs using a plurality of transistors of a first oxide thickness to produce a pair of differential pair of outputs. Then, the method preferably requires level shifting the buffered pair of differential outputs using a plurality of transistors of a second oxide thickness, wherein the second oxide thickness is less than the first oxide thickness, in order to provide gain to the differential outputs to form a gained pair of differential outputs. Then the method includes boosting the gained pair of differential outputs and converting the boosted pair of differential outputs into a single signal.

The method may also include boosting the pair of differential outputs using a plurality of transistors having a third oxide thickness. The third oxide thickness is preferably less than the second oxide thickness. The buffering may use a first supply voltage, the level shifting may use a second supply voltage, and the boosting and converting may use a third supply voltage. Preferably, the magnitude of the first supply voltage is greater than the magnitude of the second supply voltage, and the magnitude of the second supply voltage is greater than the third supply voltage.

One further feature of the invention is that the method according to the invention may include using a single circuitry that can accommodate switching the external clock signal from an AC signal to a DC signal. In yet another feature of the invention, the method of the invention may also include being able to adapt the common mode voltage of the invention across a broad spectrum of ranges such as from a range 0.25 volts to 0.55 volts to a range of 1.8825 volts to 2.05 volts.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DESCRIPTION OF THE INVENTION

Figure 1:
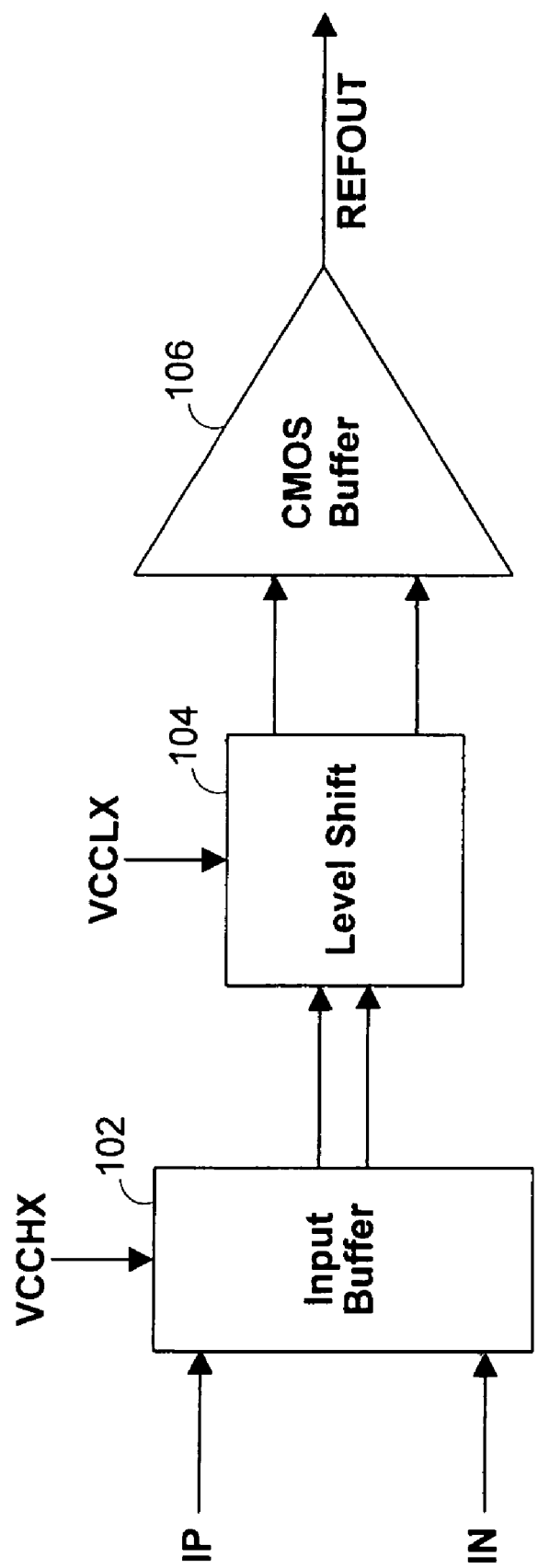
FIG. 1 is a schematic drawing of a conventional reference clock receiver structure.
Figure 2:
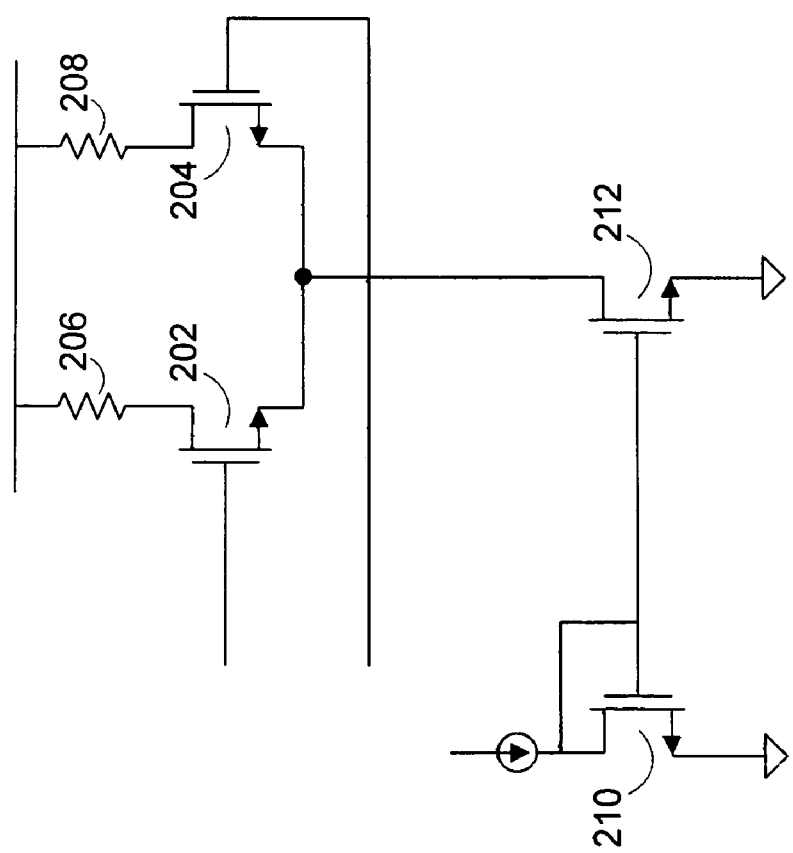
FIG. 2 is a schematic drawing of an input buffer with an NMOS differential pair of transistors.
Figure 3:
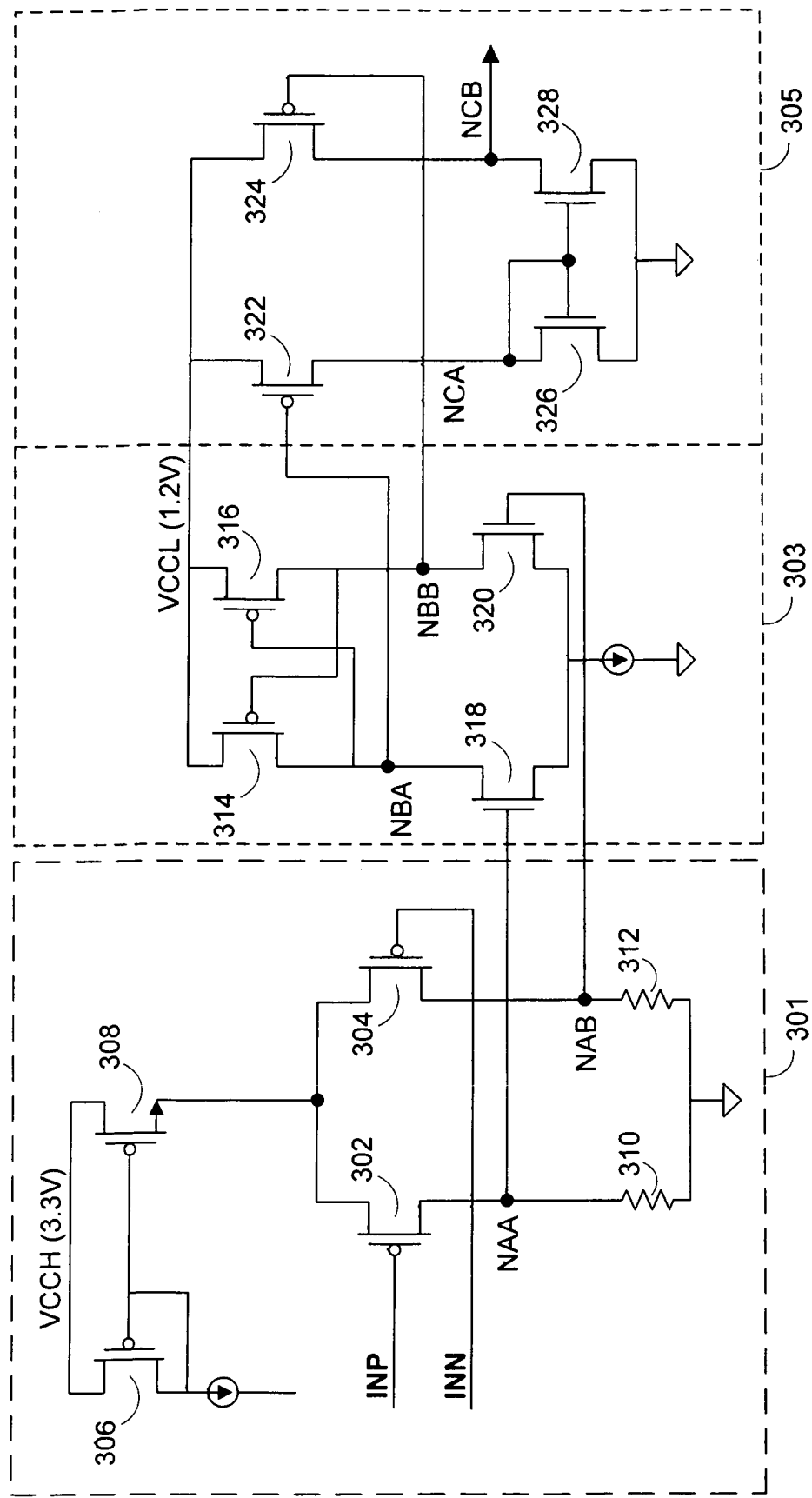
FIG. 3 is a schematic drawing of a reference clock receiver structure according to the invention.

FIG. 3 shows a reference clock receiver 300 according to the invention. Reference clock receiver 300 preferably includes three stages: input buffer 301, level shifter 303 and differential-to-single ended converter 305.

Input buffer 301 preferably is formed from a PMOS-based differential pair of transistors 308 and 310 (together with resistors 310 and 312 and current mirror transistors 306 and 308) as opposed to the NMOS-based differential pair. By using a supply voltage VCCH=3.3 volts, the input common-mode range can go from about 0 volts to about 2.2 volts. This range is able to cover the voltage common-mode specifications of many industry standards such as PCI-Express (Vcm=0.25V~0.55V), LVPECL (Vcm=1.8825V~2.05V) and LVDS (Vcm=1.25 volts).

Receiver 300 preferably converts relatively high voltage levels to a core voltage level (1.2 volts). Because of this function, receiver 300 preferably uses thick oxide transistors 302, 304, 306 and 308. Thick oxide transistors are preferably able to accommodate supply voltages up to about 3.3 volts.

Level Shifter 303 and differential-to-single-ended converter 305 may preferably be supplied by a supply of 2.2 volts. Appropriate circuit design allows voltage on nodes NAA and NAB to be less than 1.8 volts. Therefore 1.8 volt medium-oxide transistors 318 and 320 can be used in the level shifter input stage. The remaining transistors 314, 316, 322, 324, 326 and 328 in the circuit can preferably be all 1.2 volt thin-oxide devices. One result of the remaining transistors being 1.2 volts is that output node NCB can be 1.2 volts.

In one embodiment of the invention, both DC coupling and AC coupling are supported in order to maximize the interoperability between an external reference source driver and the input of reference clock receiver 300 according to the invention. This is shown in more detail in FIG. 4.

Figure 4:
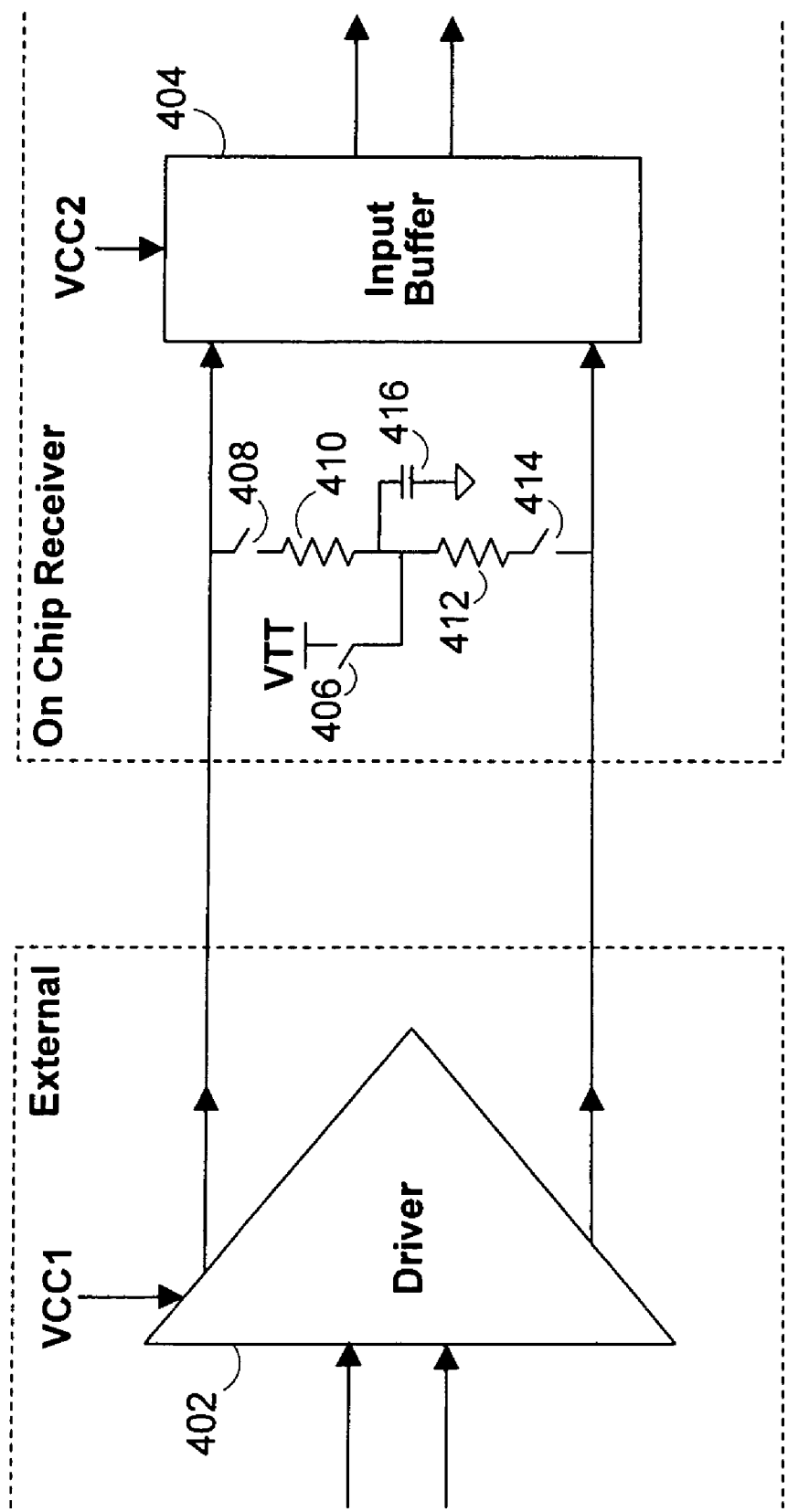
FIG. 4 is a schematic drawing of an adaptive coupling circuit.

The coupling circuit of FIG. 4 may be used to implement DC coupling of an external driver 402 to the input buffer 404 of an on-chip receiver. For DC coupling, the external driver 402 and on-chip receiver 300 (see FIG. 3) typically have a similar power supply or common-mode voltage for full compatibility. An on-chip voltage regulator (not shown) may be used to provide a programmable termination voltage, Vtt. Voltage Vtt is preferably programmable based on the operation of switches 406, 408, and 414 as well as resistors 410 and 412 and capacitor 416.

For example, in one embodiment of the invention, floating termination options on the receiver side can be provided for PCI-Express by opening switches 410 and 414 (switch 406 is closed in this case to avoid floating on node A).

For AC coupling, that may also be implemented by the circuit shown in FIG. 4, the receiver internal termination voltage Vtt is provided on-chip by closing switches 406, 408, and 414. In such an embodiment, Vtt voltage can be set up to be 1.2 volts (the supply voltage) without any additional circuitry. AC coupling preferably provides the maximum interoperability between transmitter and receivers using different power supplies.

The circuit as described preferably enjoys at least the following advantages over the conventional circuitry.

The input receiver structure according to the invention preferably utilizes a PMOS differential pair in the input buffer which extends the input common-mode range lower and, in suitable circumstances, even to zero. The receiver structure according to the invention also preferably utilizes different supply voltages for the different component parts (such as the input buffer, the level shifter and the differential-to-single-ended converter) in order to convert high voltage level input signals to regular voltage level reference clocks. As such, a mix of thick, medium, and thin oxide devices can be used to avoid electrical overstress.

Other advantages of circuits according to the invention include a new structure for providing for a termination voltage setting and a termination resistor. The structure can preferably provide different combinations which, in turn, can satisfy different specifications. For example, when AC coupling is required, termination voltage Vtt can easily be set up to be 1.2 volts without using additional circuitry. Because of all these, and other various advantages, a reference clock receiver structure according to the invention is able to support most industry standards, such as PCI-Express, PECL and LVDS, and also have compliance with AC and DC coupling.

Figure 5:
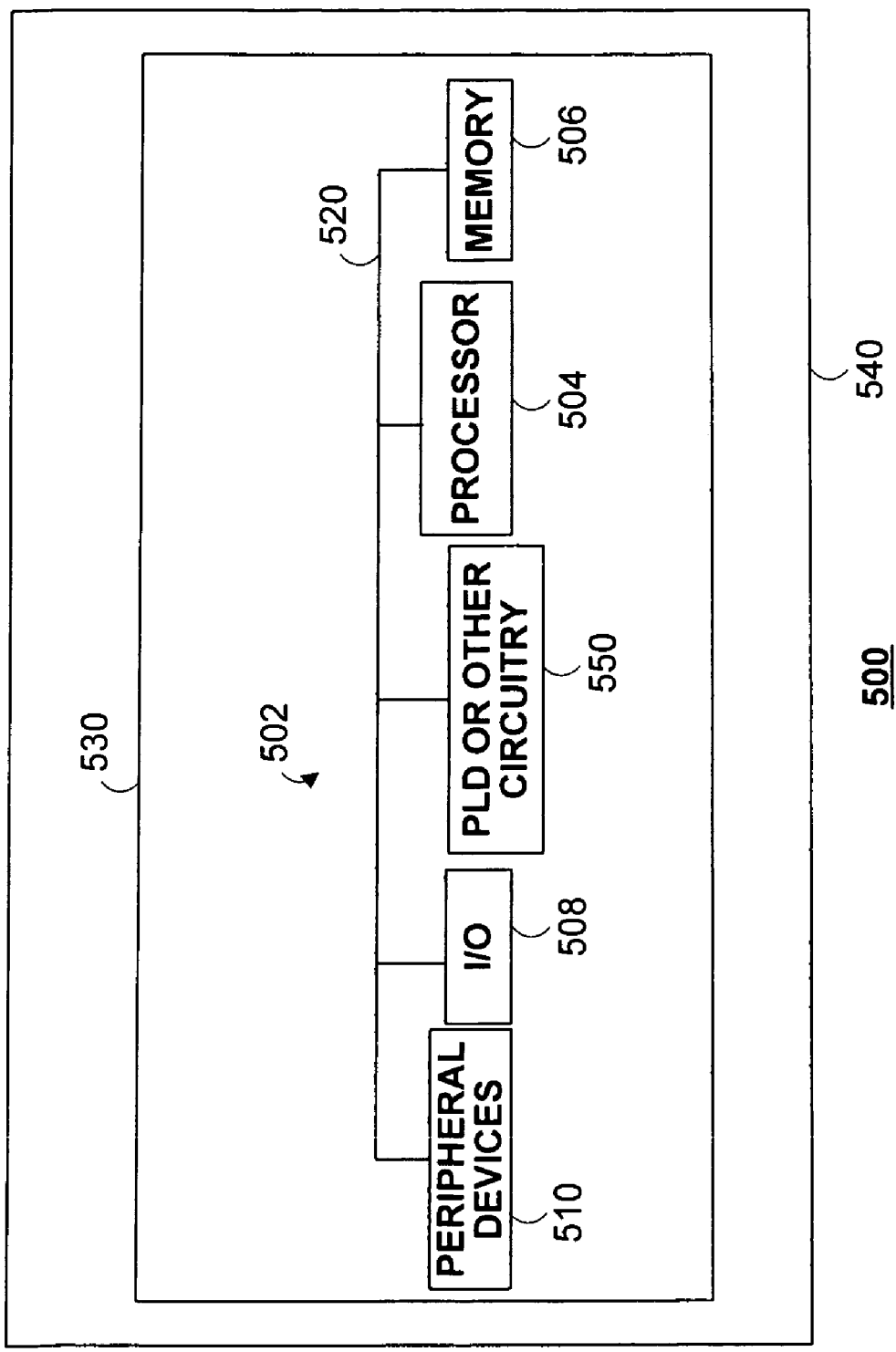
FIG. 5 is a schematic drawing of a PLD or other circuitry that may incorporate systems and methods in accordance with the present invention.

FIG. 5 illustrates a PLD or other circuitry 500 (such as a CPLD or structured ASIC) in a data processing system 502 that may incorporate systems and methods in accordance with the invention. Data processing system 502 may include one or more of the following components: a processor 504; memory 506; I/O circuitry 508; and peripheral devices 510. These components are coupled together by a system bus or other interconnections 520 and are populated on a circuit board 530 (e.g., a printed circuit board), which is contained in an end-user system 540. Any of the interconnections between element 550 and any other elements may be made in a manner known to one skilled in the art.

System 502 can be used in a wide variety of applications, such as computer networking, data networking, instrumentation, video processing, digital signal processing, or any other application where the advantage of using programmable or reprogrammable logic is desirable. Circuitry 550 (which may include a DPLL (digital phased lock loop or other suitable circuitry) or can be used to perform a variety of different logic functions. For example, circuitry 550 can be configured as a processor or controller that works in cooperation with processor 504. Circuitry 550 may also be used as an arbiter for arbitrating access to a shared resource in system 502. In yet another example, circuitry 550 can be configured as an interface between processor 504 and one of the other components in system 502. It should be noted that system 502 is only exemplary, and that the true scope and spirit of the invention should be indicated by the following claims.

Thus, it is seen that systems and methods for providing a reference clock receiver structure have been provided. One skilled in the art will appreciate that the present invention can be practiced by other than the described embodiments, which are presented for purposes of illustration rather than of limitation, and the present invention is limited only by the claims which follow.

What is claimed is:

1. A reference clock receiver structure comprising:
   an input buffer comprising a PMOS differential pair of transistors and a first supply voltage, the PMOS differential pair of transistors receiving a pair of differential inputs and producing a pair of differential outputs;
   a level shifter that is coupled to receive the pair of differential outputs from the input buffer to provide gain to the pair of differential outputs to form a gained pair of differential outputs, the level shifter that comprises a second supply voltage, the second supply voltage having a smaller magnitude than the first supply voltage; and
   a CMOS buffer that is coupled to receive the gained pair of differential outputs, to boost the gained pair of differential outputs and to convert the gained differential pair outputs into a single signal.

2. The reference clock receiver structure of claim 1 wherein the CMOS buffer comprises a third supply voltage, the third supply voltage having a magnitude less than the magnitude of the second supply voltage.

3. The reference clock receiver structure of claim 1, the input buffer comprising a plurality of input buffer transistors and the level shifter comprising a plurality of level shifter transistors, wherein at least one of the input buffer transistors comprises thicker oxide than at least one of the level shifter transistors.

4. The reference clock receiver structure of claim 1, the level shifter comprising a plurality of level shifter transistors and the CMOS buffer comprising a plurality of CMOS buffer transistors, wherein at least one of the level shifter transistors comprises thicker oxide than at least one of the CMOS buffer transistors.

5. The reference clock receiver structure of claim 1 further comprising an adaptive coupling circuit coupled to an input of the input buffer.

6. The reference clock receiver structure of claim 1 that is capable of operating over a common mode range of 0.25 volts to 2.05 volts.

7. The reference clock receiver structure of claim 1 that is capable of operating over the following common mode voltage ranges: 0.25 volts to 0.55 volts, 1.8825 volts to 2.05 volts and 1.25 volts.

8. A method of converting an external clock signal source in the form of a differential pair into a reference clock signal, the method comprising:
  receiving the pair of differential inputs;
  buffering the pair of differential inputs using a plurality of transistors of a first oxide thickness to produce a pair of differential outputs;
  level shifting the pair of differential outputs using a plurality of transistors of a second oxide thickness, wherein the second oxide thickness is less than the first oxide thickness, to provide gain to the differential outputs to form a gained pair of differential outputs;
  boosting the gained pair of differential outputs; and
  converting the boosted pair of differential outputs into a single signal.

9. The method of claim 8, the boosting comprising boosting using a plurality of transistors having a third oxide thickness, wherein the third oxide thickness is less than the second oxide thickness.

10. The method of claim 8 further comprising buffering using a first supply voltage, level shifting using a second supply voltage, and boosting and converting using a third supply voltage, the magnitude of the first supply voltage being greater than the magnitude of the second supply voltage, and the magnitude of the second supply voltage being greater than the third supply voltage.

11. The method of claim 8 wherein the external clock signal is selected from the group consisting of an AC signal and a DC signal.

12. The method of claim 8 wherein a common mode voltage range of the received pair of differential inputs is selected from the group consisting of: 0.25 volts to 0.55 volts and 1.8825 volts to 2.05 volts.

13. A reference clock receiver structure comprising:
  an adaptive coupling circuit that receives a pair of differential inputs from an external reference source driver and that adapts the pair of inputs to provide an adapted pair of inputs;
  an input buffer that is coupled to receive the adapted pair of inputs and that produces a differential pair of outputs;
  a level shifter that is coupled to receive the pair of outputs to provide gain to the pair of outputs to form a gained pair of outputs;
  a CMOS buffer that is coupled to receive the gained pair of outputs and to convert the gained pair of outputs into a single signal; and
  wherein the input buffer is supplied by a first supply voltage and the level shifter is supplied by a second supply voltage, the first supply voltage having a greater magnitude than the second supply voltage.

14. The reference clock receiver structure of claim 13 wherein the CMOS buffer is supplied by a third supply voltage, the second supply voltage having a greater magnitude than the third supply voltage.

15. The reference clock receiver structure of claim 13 wherein the CMOS buffer is supplied by a third supply voltage, the first supply voltage having a greater magnitude than the third supply voltage.

16. The reference clock receiver structure of claim 13, the input buffer comprising a plurality of input buffer transistors and the level shifter comprising a plurality of level shifter transistors, wherein at least one of the input buffer transistors comprises thicker oxide than at least one of the level shifter transistors.

17. The reference clock receiver structure of claim 13, the level shifter comprising a plurality of level shifter transistors and the CMOS buffer comprising a plurality of CMOS buffer transistors, wherein at least one of the level shifter transistors comprises thicker oxide than at least one of the CMOS buffer transistors.

18. A digital processing system comprising:
  processing circuitry;
  a memory coupled to said processing circuitry; and
  a programmable logic device comprising a reference clock receiver structure as defined in claim 13 coupled to the processing circuitry and the memory.

19. A printed circuit board on which is mounted the programmable logic device as defined in claim 18.

20. The printed circuit board defined in claim 19 further comprising:
  memory circuitry mounted on the printed circuit board and coupled to the programmable logic device.

21. The printed circuit board defined in claim 20 further comprising:
  processing circuitry mounted on the printed circuit board and coupled to the memory circuitry.

* * * * *